US010435567B2

(12) United States Patent
Slagter et al.

(10) Patent No.: US 10,435,567 B2
(45) Date of Patent: Oct. 8, 2019

(54) FLUORINATED AND HYDROGENATED DIAMOND-LIKE CARBON MATERIALS FOR ANTI-REFLECTIVE COATINGS

(71) Applicants: THE MACKINAC TECHNOLOGY COMPANY, Grand Rapids, MI (US); FRAUNHOFER USA, INC., Plymouth, MI (US)

(72) Inventors: John Thomas Slagter, Grand Rapids, MI (US); David V. Tsu, Auburn Hills, MI (US); Lars Haubold, East Lansing, MI (US); Thomas Schuelke, Brighton, MI (US)

(*) Notice: Subject to any disclaimer, the term of this patent is extended or adjusted under 35 U.S.C. 154(b) by 0 days.

(21) Appl. No.: 15/117,728

(22) PCT Filed: Feb. 12, 2015

(86) PCT No.: PCT/US2015/015517
§ 371 (c)(1),
(2) Date: Aug. 10, 2016

(87) PCT Pub. No.: WO2015/123367
PCT Pub. Date: Aug. 20, 2015

(65) Prior Publication Data
US 2017/0166753 A1 Jun. 15, 2017

Related U.S. Application Data
(60) Provisional application No. 61/938,668, filed on Feb. 11, 2014.

(51) Int. Cl.
C09D 5/00 (2006.01)
C23C 14/00 (2006.01)
(Continued)

(52) U.S. Cl.
CPC .............. *C09D 5/006* (2013.01); *C01B 32/25* (2017.08); *C09D 1/00* (2013.01); *C23C 14/0057* (2013.01);
(Continued)

(58) Field of Classification Search
CPC .......... G02B 1/11; G02B 1/118; G02B 1/111; G02B 1/115; G02B 1/14; G02B 1/18;
(Continued)

(56) References Cited

U.S. PATENT DOCUMENTS 6,468,642 B1* 10/2002 Bray ....................... B26B 21/60
428/216
2002/0155294 A1* 10/2002 Veerasamy ............ B05D 5/083
428/408
(Continued)

*Primary Examiner* — Evan P Dzierzynski
*Assistant Examiner* — Sharrief I Broome
(74) *Attorney, Agent, or Firm* — Rohm & Monsanto, PLC

(57) ABSTRACT

Fluorinated and hydrogenated diamond-like carbon ("DLC-FH") that have unique optical properties differ as a class from the existing DLC art, whose refractive indices [$\eta$]are limited to rather high values above a lower threshold of 1.7, and can range up to about 2.7. The DLC-FH materials can achieve very low refractive indices at 550 nm wavelength, [$\eta_{550}$], i.e., below 1.5, and especially demonstrated down to 1.3. Moreover, whereas the absorption for the existing DLC art, as quantified by the extinction coefficient [$\kappa$] at a wavelength of 550 nm, [$\kappa_{550}$] is limited to about 0.04, our DLC-FH material can achieve [$\kappa_{550}$] below 0.01. Both of these attributes, i.e., low [$\eta_{550}$] and low [$\kappa_{550}$] means that, for the first time, a carbon-based material as represented by the DLC-FH material, can be used for anti-reflection (AR) coating, wherein there are no longer any restrictions in how they can be used to promote low reflectance (with low fit[$\eta$]) and high transmittance (with low [$\kappa$]). A dual-energy deposition process, using a Laser Arc for the high energy component creates a plasma of energized carbon atoms and
(Continued)

ions, and excites a down-stream flow of fluorine and hydrogen containing gases to deposit an AR coating on a substrate which may be, windows typical of transportation vehicles (land, sea, air), and buildings.

13 Claims, 12 Drawing Sheets

(51) Int. Cl.
| | | |
|---|---|---|
| *C23C 14/06* | (2006.01) | |
| *C23C 14/28* | (2006.01) | |
| *C09D 1/00* | (2006.01) | |
| *G02B 1/11* | (2015.01) | |
| *H01J 37/34* | (2006.01) | |
| *C01B 32/25* | (2017.01) | |

(52) U.S. Cl.
CPC ...... *C23C 14/0605* (2013.01); *C23C 14/0611* (2013.01); *C23C 14/28* (2013.01); *G02B 1/11* (2013.01); *H01J 37/3426* (2013.01); *H01J 37/3467* (2013.01)

(58) Field of Classification Search
CPC .... G02B 27/0018; G02B 1/12; G02B 5/0221; G02B 1/04; G02B 1/113; G02B 5/0294; G02B 27/0006; G02B 5/3033; G02B 1/10; G02B 7/021; G02B 1/02; G02B 1/105
See application file for complete search history.

(56) References Cited

U.S. PATENT DOCUMENTS

| | | | | |
|---|---|---|---|---|
| 2010/0310863 | A1* | 12/2010 | Kuchiyama | ........... C23C 14/086 428/336 |
| 2013/0182331 | A1* | 7/2013 | Hebrink | ................. B82Y 20/00 359/601 |
| 2014/0220840 | A1* | 8/2014 | Koene | .................... D06M 11/36 442/80 |
| 2016/0003981 | A1* | 1/2016 | Twitchen | ................. G02B 1/02 359/601 |

* cited by examiner

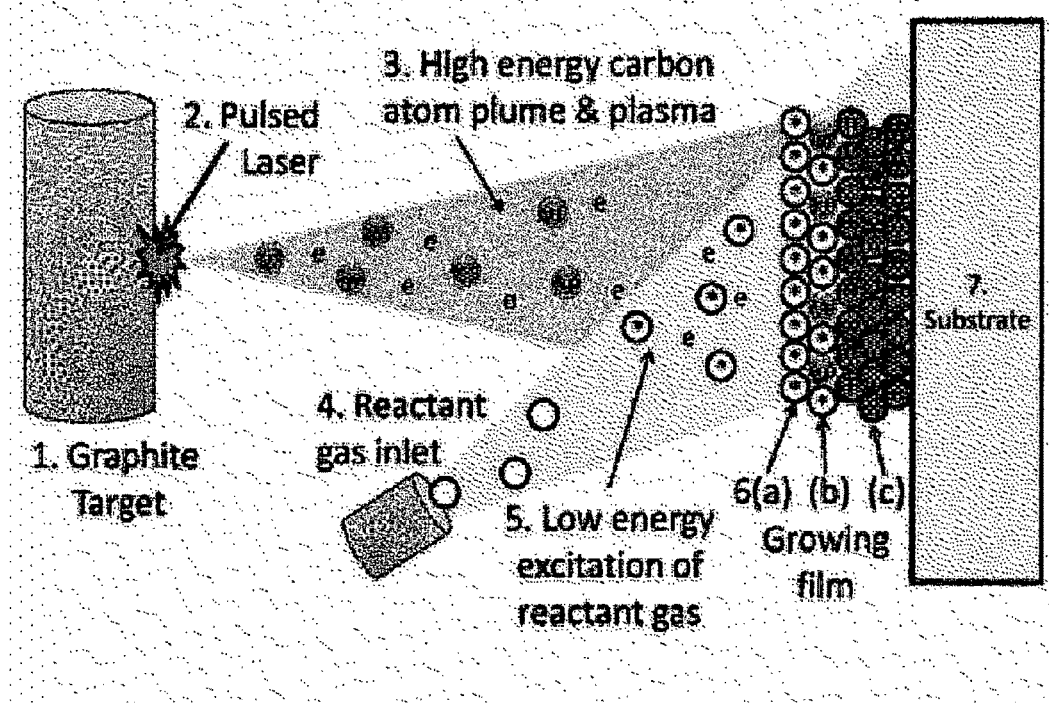

FLUORINATED AND HYDROGENATED DIAMOND-LIKE CARBON MATERIALS FOR ANTI-REFLECTIVE COATINGS

RELATIONSHIP TO OTHER APPLICATION

This application claims the benefit of the filing date of U.S. Provisional Patent Application Ser. No. 61/938,668 filed on Feb. 11, 2014, Conf. No. 4697 (Foreign Filing License Granted) in the names of the same inventors as herein. The disclosure in the identified U.S. Provisional Patent Application is incorporated herein by reference.

BACKGROUND OF THE INVENTION

Field of the Invention

This invention relates generally to anti-reflective coatings and methods of depositing AR coatings, and more particularly, to a fluorinated and hydrogenated "diamond-like carbon" (DLC-FH) coating material and method of depositing same, particularly on large substrates, such as vehicle or building windows.

Description of the Prior Art

Anti-reflection (AR) coatings are applied to the surfaces of optical devices to reduce reflection, and hence, to maximize transmission of light. However, due to limitations in material properties of presently available AR coatings and in coating deposition techniques, the use of AR coatings has been restricted mainly to niche applications involving objects having comparatively small spatial dimensions, such as eye glasses, cameras, binoculars, refractive telescopes, microscopes, and the like.

There is a need, however, for AR coating materials and deposition techniques for applying AR coatings to objects having larger dimensions, such as vehicle and building windows. Vehicle and building windows are exposed to harsh environmental conditions, and therefore, it is important that any AR coatings developed for these purposes must be mechanically durable, that is, scratch and abrasion resistant, and, of course, water insoluble. There is, thus, a need for mechanically durable and water insoluble AR coating materials, and a method of applying them to large scale objects.

It is well-known to use AR coatings to enhance human comfort, such as by reducing glare in eye glasses, or to enhance the optical performance of lenses. The performance of cameras, for example, is enhanced because the AR coating permits collection of a greater amount of light under dim conditions while reducing stray light for greater image contrast. However, there is also a need for AR coating technology to enhance public safety.

A recent study published by Flannagan, et al., "Effects of Automotive Interior Lighting on Driver Vision," LEUKOS, Vol. 9, No. 1, page 9 (July 2012), demonstrated that "veiling" light during nighttime operation of automobiles can distract the driver and reduce his ability to detect the presence of pedestrians. This veiling light originates from light sources within the automotive cabin, which reflects off the front windshield back into the driver's eyes. AR technology could find widespread application for public safety purposes, if it could be accomplished on large scale platforms, such as on vehicle windows. Reducing the effect of veiling light would enable a driver to perceive dimly lit objects outside the vehicle more quickly, thereby increasing the time for reaction. Increasing the time for reaction is key to increasing transportation safety.

In passenger automobiles, where the principal source of veiling light derives from the dashboard, this safety factor is comparatively minor because the interior light sources are relatively weak. However, veiling light distraction is particularly problematic for municipal transit systems. By regulatory mandate, the interior cabin of a bus must be illuminated to significantly greater levels. Moreover, cabin geometry is another contributing factor that exacerbates the problem in a bus versus an automobile. While the sloping windshield of an automobile helps to direct reflected interior light down and away from the driver, the nearly vertical windshield of a typical bus is ideal for directing reflected light directly toward the driver.

Altering the interior light levels in public transportation would require regulatory action and changing the slope of the windshield would require a re-design of the vehicle and public acceptance of the new aesthetics. It would be easiest to find a technological solution to mitigate against the high native reflection of uncoated glass as presently used in the vehicle windshield. Unfortunately, while the need for AR treatment of the front windshield is eminently clear, the solution to addressing this need is not.

As indicated above, there are two fundamental shortcomings of traditional AR solutions for large area applications, involving: (i) limitations to required refractive index and durability of existing materials; and (ii) limitations with the deposition methods presently employed to apply the materials.

The traditional approach to AR coatings uses quarter-wave interference layers whereby the refractive index of the AR layer $[\eta_{AR}]$ must equal the square root of the refractive index of the glass $[\eta_{glass}]$. See, for example, Hecht, et al., OPTICS, (Addison-Wesley, Reading, MA, 1974), p.313. For high index substrates, like crystalline germanium used in infrared optics, where the refractive index of the substrate $[\eta_{sub}]$ about 4.0, the $[\eta_{AR}]$ should be about 2.0. There are many materials (including the DLC materials discussed below) which have indices of around 2 which make them suitable for use as an AR coating on a high index substrate.

It has been a challenge, however, to find materials having a sufficiently low refractive index to pair with low index substrate materials, such as the soda lime glass (SLG), commonly used for automotive windows and commercially available windows for building, which has a $[\eta_{glass}]$ of 1.525, or translucent polymers having indices between 1.55 and 1.65. This means that $[\eta_{AR}]$ should ideally be about 1.235. It is difficult to find materials having refractive indices lower than even about 1.34 as shown in Table 1 should ideally be about 1.235. It is difficult to find materials having refractive indices lower than even about 1.34 as shown in Table 1.

Table 1 shows a list of the five materials currently known to have low refractive index, i.e., $[\eta]<1.4$.

TABLE 1

| Material | | Main Deposition Technique(s) | Refractive Index ($\eta$) |
| --- | --- | --- | --- |
| Calcium fluoride | ($CaF_2$) | Mo or Ta boat evaporation, e-beam evaporation | 1.23 to 1.26 at 546 nm |
| Cryolite | ($Na_3AlF_6$) | Ta boat evaporation | 1.35 at 550 nm |
| Lithium fluoride | (LiF) | Ta boat evaporation | 1.36 to 1.27 at 546 nm |
| Magnesium fluoride | ($MgF_2$) | Ta boat evaporation | 1.38 at 550 nm |

TABLE 1-continued

| Material | | Main Deposition Technique(s) | Refractive Index (η) |
|---|---|---|---|
| Sodium fluoride | (NaF) | Ta boat evaporation | 1.34 in visible |

Molybdenum (Mo); Tantalum (Ta)
MacLoed, *Thin-Fim Optical Filters, 3rd Edition*, (Institute of Physics, Philadelphia, 2001), p. 621

All of the low refractive index materials shown on Table 1 are fluorides, and unfortunately, would not be suitable for large area applications, such as vehicle windshields or building windows. First, there are several material property issues that fundamentally preclude their consideration. These materials tend to be soft and, therefore, would be easily scratched. Moreover, the solubility of these ionic materials in water, while low, is not zero. Therefore, they would have poor long term durability (and stability) under exposure to wet environments (e.g., fogging on the interior and exposure to snow, ice and rain on the exterior) and under the typical expected physical abuse (e.g., windshield wipers, dirt and insect impacts, hands)

Second, fluoride cannot be sputtered easily. According to Macleod, id., "Many of the [optical] materials, with the principal exception of the fluorides, can be sputtered in their dielectric form by either radio frequency sputtering or neutral ion-beam sputtering." Unfortunately, sputter deposition is a widely used method for accurately, and cost effectively, applying thin films on substrates ranging in size from small to quite large. This alone is a major impediment to applying these known low-index materials onto very large substrates to achieve AR functionality.

There is a need, therefor, for low refractive index materials for use as AR coatings on large substrates, such as windshields and windows, which are robust enough to endure use in a harsh environment, and which can be applied economically to a large scale substrate.

In order to overcome the shortcomings of known prior art AR materials, we investigated diamond-like carbon (DLC), and in particular, chemical modifications to known DLC material involving the addition of fluorine and hydrogen. As used herein, the terms "DLC-F" or "DLC-H" refer to DLC materials that have the addition of fluorine (F) or hydrogen (H). The term "DLC-FH" has been used herein for the composition of the present invention, which is a fluorinated and hydrogenated diamond-like carbon material having advantageous physical and optical properties. It is to be understood, however, that as used in the discussion herein, the term also encompasses DLC compounds, produced in accordance with the method of the present invention, that have the equivalent advantageous physical and optical properties. In the literature, DLC materials are also referred to as amorphous hydrogenated carbon (a-C:H). See, for example, Alterovitz, et al., "Amorphous Hydrogenated 'Diamondlike' Carbon Films and Arc-Evaporated Carbon Films", in *Handbook of Optical Constants of Solids II*, Edited by E. D. Palik (Academic, New York, 1998), p. 837.

Regardlss of the nomenclature, these materials are not to be confused with "diamond," which is a crystalline form of carbon having purely $sp^3$ hybridized atomic bonds between carbon atoms (C-C bonds) forming the most rigid network of three-dimensionally and tetrahedrally arranged carbon atoms. Instead, DLC or a-C:H materials are amorphous, with a mixture of $sp^3$ and $sp^2$ (two-dimensional trigonal arrangement of carbon atoms as found in graphene or monolayers of graphite) hybridized bonding, and which can have up to 25atom % hydrogen (in the form of C-H bonds). Nor should these materials be confused with the many different forms of soft amorphous carbon (e.g., sputtered carbon, soot, etc.) which tend to be soft by having very low, and indeed, zero $sp^3$ bonding content. The DLC nomenclature is used to convey the fact that these materials incorporate sufficient $sp^3$ hybridized C-C bonds to be very tough, stiff and hard, and with very low friction. In its unmodified pure carbon state, DLC materials are also commonly referred to as "tetrahedral amorphous carbon" (ta-C) to highlight the preponderance of $sp^3$ hybridization. See, for example, Haubold, et al., "The influence of the surface texture of hydrogen-free tetrahedral amorphous carbon films on their wear performance", *Diamond Relat. Mater.*, Vol. 19, page 225 (2010); Yang, et al., "Electroanalytical Performance of Nitrogen-Containing Tetrahedral Amorphous Carbon Thin Film Electrodes,"*Anal. Chem.*, Vol.84, No. 14, page 6240 (2012).

While known DLC has excellent physical attributes, it is not normally considered to be an anti-reflective material. This is because its refractive index, $[\eta_{DLC}]$, ranges from between about 1.7 and 2.2 which is too high to match with most glass and polymer substrates. Alterovitz, supra. However, DLCs have been used in anti-reflective optical stacks to provide abrasion resistance. One known use of DLCs for this purpose is as an AR coating for mobile electronic device displays. See, Madocks, et al., "Durable Neutral Color Anti-Reflective Coating for Mobile Displays," *SVC Bulletin*, p. 32, Fall 2014.

In order to demonstrate novelty of the present invention, specifically the DLC-FH composition of matter embodiment, as used for AR coatings, it is important to understand the restrictions of the use of DLC materials in an optical stack arrangement, and how multilayer optical AR stacks are designed.

Using a single thin film layer to achieve AR is the simplest case, where the refractive index of the AR layer must conform to a condition relative to the substrate, defined by equation (1), where $n_{AR}$ $\eta_{AR}$ is the refractive index of the AR coating and $n_{sub}$ is the refractive index of the substrate, $$[n_{AR}] = \sqrt{n_{sub} \times n_{air}}, \qquad \text{Eqn. (1)}$$

Since the refractive index of air $[\eta_{air}]$ is very close to 1.0, Eqn. (1) becomes the more familiar Eqn. (2)

$$[n_{AR}] = \sqrt{n_{sub}}, \qquad \text{Eqn. (2)}$$

Since, as indicated above, the AR coating must be a quarter-wavelength thick [¼λ], the physical thickness of the AR layer $[\delta_{AR}]$ must be defined by Eqn. (3)

$$d_{AR} = \frac{1}{4} \frac{\lambda_o}{n_{AR}}, \qquad \text{Eqn. (3)}$$

where $\lambda_o$ is the design wavelength in the incident medium where the reflectance is minimized.

For high index substrates, like crystalline germanium used in infrared optics, where the $[\eta_{sub}]$ is about 4.0, the $[\eta_{AR}]$ should be about 2.0. There are many materials that have indices of around 2, including the DLCs. However, it has been a challenge to find materials having a sufficiently low refractive index to pair with low index substrate materials, such as the soda lime glass (SLG), commonly used in the commercial window industry, which has a refractive index of 1.525, or translucent polymers having indices between 1.55 and 1.65. This means that $[n_{ar}]$ $[\eta_{AR}]$. should be about 1.235, and this represents an enormous materials challenge since it is difficult to find materials having refractive indices lower than even about 1.34 as shown in Table 1.

Another known way to produce AR coatings is through the use of two or more stacked layers of alternating low and high index materials. Basically, the refractive indices of the thin film stack configuration should be the following: [air/low /high/substrate/ . . . ]. The words "low" and "high" refer to the low index [$\eta_{low}$] and high index [$\eta_{high}$] layers relative to the index of the substrate [$\eta_{sub}$], i.e., where [$\eta_{low}$]<[$\eta_{high}$] and [$\eta_{high}$]>[$\eta_{sub}$].

H. A. Macleod, supra., at page 111, shows that the physical thickness of each layer, [$d_{low}$] and [$d_{high}$], depends on the refractive indices, where the phase thickness ($\delta_1$) for layer-1 (the low-index layer) is given by $$\tan^2 \delta_1 = \frac{(n_s - n_a) \times (n_{high}^2 - n_a n_s) n_{low}^2}{(n_s n_{low}^2 - n_a n_{high}^2) \times (n_a n_3 - n_{low}^2)} = A_1, \quad \text{Eqn. (4a)}$$

and the phase thickness for layer-2 (the high-index layer) is given by $$\tan^2 \delta_2 = \frac{(n_s - n_a) \times (n_a n_s - n_{low}^2) n_{high}^2}{(n_3 n_{low}^2 - n_a n_{high}^2) \times (n_{high}^2 - n_a n_s)} = A_2 \quad \text{Eqn. (4b)}$$

The phase thickness ($\delta_i$) is given in terms of the physical layer thickness (d) according to Eqn. (5)

$$\delta_i = 2\pi n_i \frac{d_i}{\lambda_o}, \quad \text{Eqn. (5)}$$

in terms of the refractive index of layer (i) and the design wavelength in the incident medium ($I_a$). The form of the expressions in Eqns. (4), i.e., the square of the tangent functions, shows that there are in fact two solutions for each $d_i$. In other words, Eqns. (4) can be expressed as $$\tan \delta_1 = \pm \sqrt{A_1}, \quad \text{Eqn. (6a)}$$

and $$\tan \delta_2 = \pm \sqrt{A_2}, \quad \text{Eqn. (6b)}$$

Therefore, the two solutions (for each layer) are $$\delta_1^{\pm} = \pm \tan^{-1} \sqrt{A_1}, \quad \text{Eqn. (7a)}$$

and $$\delta_2^{\pm} = \pm \tan^{-1} \sqrt{A_2}. \quad \text{Eqn. (7b)}$$

FIG. 1 is a graphical representation of these positive (+) and negative (−) solutions. The negative solution seems to imply a negative thickness by Eqn. (5). However, this same negative slope (i.e., negative arctangent) can be achieved by the positive phase angle of ($\pi - \delta$). Therefore, the positive solutions are $$\delta_i^p = \delta_i^o = +\tan^{-1} \sqrt{A_i} \quad \text{Eqn. (8a)}$$

and the negative solutions are $$\delta_i^n = \pi - \delta_i^o \quad \text{Eqn. (8b)}$$

Once it is recognized that the solutions are in terms of cyclical radians, a natural consequence is that there must be many periodic solutions, i.e., solutions which repeat every $2\pi$ radians. Evidently, the solutions in Eqn. (8) represent the zeroth order (m=0), but there must also be infinite number of solutions for m=1, 2, 3, etc. It can, therefore be shown using Eqns. (5) and (8), that all positive-solution thickness values for layer (i) are, for order (m), $$d_i^p(m) = \frac{\lambda_o}{n_i} \frac{1}{2\pi}(2\pi m + \delta_i^o), \quad \text{Eqn. (9a)}$$

and the corresponding negative-solution thickness values are $$d_i^n(m) = \frac{\lambda_o}{n_i} \frac{1}{2\pi}\left[2\pi\left(m + \frac{1}{2}\right) - \delta_i^o\right]. \quad \text{Eqn. (9b)}$$

The negative solution values, therefore, have a greater physical thickness compared to the related positive solution values. Using the appropriate spectral calculations, it has been found that the AR condition requires using the positive solution for one layer, and the negative solution for the adjacent layer. In other words, the two correct ($d_1$, $d_2$) sets are ($d^p_1$, $d^n_2$) and ($d^n_1$, $d^p_2$) and not ($d^p_1$, $d^p_2$) and ($d^n_1$, $d^n_2$) as previously thought.

The known multi-layer AR stack arrangement described Madocks, supra., serves as an example. Madocks used a plasma-enhanced chemical vapor deposition (PECVD) method to form $SiO_2$ as the [$\eta_{low}$] layer (~1.45), and SiN as the [$\eta_{high}$] layer (~1.95 to 2.1) in a stacked configuration having a total of six layers in three consecutive pairs of the high/low design. While one high/low pair can achieve AR at one specified wavelength, the more high/low pairs that are used, the greater the "band width" at which the AR is achieved. Madocks capped off the sixth layer ($SiO_2$) with a very thin seventh layer consisting of a DLC. Since the refractive index of the DLC used by Madocks was about 2.0, the DLC layer is actually a "high " index layer so that [$\eta_{DLC}$]>[$\eta_{low}$]. This this means that the optical stack of Madocks ends with a high index layer, not with a low index layer as strictly required in the high/low AR design strategy outlined above.

Model calculations for the Madocks AR design are shown in FIG. 2 which is a graphical representation of the physical thickness (nm) of the high/low layers in the multi-layer AR structure comprising three sets of high/low pairs on each side of a glass substrate. As shown in FIG. 2, the thickness of the high/low layers are not the same for each of the 3 pairs that form the AR stack. Instead, once the DLC capping layer is added, it is evident that the thickness of each of these other high/low layers is modified to accommodate this disruption.

FIG. 3 is a graphical representation of the calculated visible reflectance [$R_{vis}$] of the AR structure of FIG. 2. Referring to FIG. 3, the visible reflectance [$R_{vis}$], as a function of the thickness of the DLC layer (nm), is shown for the bare glass substrate as the horizontal dotted line; for an AR stack on one side of the substrate (dashed; 1×AR); and for an AR stack on both sides of the substrate (heavy solid; 2×AR). FIG. 3 shows that the accommodation can work for very thin DLC layers, that is layers having a thickness less than about 15 nm. However, as the DLC layer thickness approaches 60 nm, the stack completely losses any AR function, with the reflectance approaching that of bare glass.

Clearly, use of unmodified DLC in this concept is restricted to layers that are less than 15 nm thick as a result of the "high" refractive index.

SUMMARY OF THE INVENTION

In a composition of matter embodiment, the diamond-like carbon (DLC) material, of the present invention (DLC-FH) contains fluorine and hydrogen. The material of the present invention has tetrahedral ($sp^3$) atom arrangements typically associated with the bonding hybridization found in diamond, and are not polymer-like (e.g., soft polytetrafluoroethylene).

The DLC-FH materials of the present invention have advantageous optical properties, specifically a "low" refractive index [$\eta$] that, in a preferred embodiments is less than about 1.7, and preferably less than about 1.5 to 1.3, or even lower. With refractive indices this low, the DLC-FH materials of the present invention can now fully participate as the $\eta_{low}$ layer in a stacked structure with no intrinsic restriction in the AR design (such as the limitation on thickness observed in FIG. 3). Since the DLC-FH materials of the present invention can be made to have indices of refraction as low as 1.30, and preferably even lower, the material of the present invention can be used as a single layer AR coating. For example, a refractive index of 1.25 is an ideal match for SLG.

Moreover, the DLC-FH material has a "low" extinction coefficient [$\kappa$] that, in preferred embodiments, is less than about 0.06, and preferably less than 0.04 to less than 0.01, and even lower. It should be noted that the foregoing values for $\eta$ and $\kappa$ are measured at a wavelength of 550 nm, representing the middle of the Visible band. Another significant and unique optical property of the material of the present invention is that it has optical bandgap ($E_g$), as determined by the method of Tauc (described more completely hereinbelow), which is greater than 1.3 electron-volt (eV), and preferably greater than about 1.5 eV.

As a result of fluorine content, one of the advantageous physical properties of the DLC-FH material of the present invention is a hydrophobicity, as quantified by the contact angle of a bead of water, that ranges from about 100° to 140°, and preferably from about 120° to 140°. Hydrophobicity makes the material resistant to the effects of water, such as rain and fog that might be encountered in the environment. Moreover, its diamond-like structure renders it scratch and abrasion resistant.

The foregoing advantageous optical properties, and in particular, the low refractive index and extinction coefficient [$\eta,\kappa$], result in a material that is well-suited for use as an AR coating on a substrate, such as glass or translucent polymer. Illustrative examples, of substrates include fused-silica glass, SLG, polyethylene terepthalate (PTE) and polycarbonate. In a preferred practical embodiment, however, the substrate is glass, and preferably soda lime glass of the type typically used for windshields and windows. It is a particular advantage of the present invention that the method of making is scalable so that the AR coating can be deposited on large scale objects. Thus, the AR coating of the present invention would be particularly suited for use in the transportation and building industries.

In accordance with a method of making embodiment of the invention, the diamond-like carbon material containing fluorine and/or hydrogen is produced in a deposition or reaction chamber by a high energy source which may be a pulsed cathodic arc (PCA) and/or pulsed laser (PL) evaporation system. Typical, energy-per-carbon atom from the pulsed energy laser beam and/or cathodic vacuum arc discharge is from about 10 electron-volt (Ev) to 500eV. The high energy source contacts a carbonaceous target, which may be graphite, to produce a plasma of highly energized carbon atoms, ions, and electrons that travel in the chamber in the direction of a distally spaced apart substrate having a growth surface. The chamber also has an inlet for the reactant gas(es) which are the source of fluorine and hydrogen species in the chamber. Illustrative reaction gases include $CF_4$, $CH_4$, and $H_2$. The inlet is arranged in the chamber between the target and the substrate so that there is a reaction zone where the fluorine and hydrogen species in the reactant gas(es) are excited by contact with electrons in the plasma to create low-energy, but highly chemically-reactive, precursor species.

The growth surface of the substrate is contacted with the low-energy, but highly chemically-reactive, precursor species as well as the highly energized carbon atoms, ions, and electrons in the plasma to deposit layers of carbon material containing fluorine and/or hydrogen on the growth surface of the substrate, so that the highly energized carbon atoms subplant beneath the top layer(s) of the carbon material to promote the formation of tetrahedral ($sp^3$) atom arrangements of the type typically associated with the bonding hybridization found in diamond.

The method of the present invention enables control over the material content, as well as the optical and physical characteristics of the deposited DLC-FH material. In the preferred method embodiments, carbon is energized to "high" levels by pulsed cathodic arc (PCA) and/or pulsed laser (PL) evaporation of carbon from a solid graphite target. These high-energy processes are physical vapor deposition (PVD) processes, which, if used in unmodified form, produces DLCs with high refractive indices [$\eta$] above 1.7. When the high energy PVD process is combined with a low energy component that involves the "down-stream" plasma activation of the fluorine and hydrogen precursor gases (e.g., $CF_4$, $CH_4$, $H_2$, etc.), the low energy component forms a growing film of carbon layers on the substrate, which incorporate C-$F_x$ (x from 1 to 3), and C-$H_y$ (y from 1 to 3) fragments, in a mechanism that closely resembles plasma enhanced chemical vapor deposition (PECVD). This low energy PECVD-like channel by itself would produce soft polymer-like materials. However, by concurrently exposing the growing PECVD-like low energy film to the high energy carbon atoms from the PL and PCA processes, the energetic carbon atoms "subplant" below the top surface of the growing film, creating on an atomic scale, subsurface conditions to form a substantial fraction of $sp^a$ bonded carbon atoms while also incorporating $sp^2$ and sp bonded C-C, as well as C-F and C-H, fragments into the film structure. See, Lifshitz, et al., "Subplantation Model for Film Growth From Hyperthermal Species: Application to Diamond," *Phys. Rev. Lett.*, Vol. 62, p. 1290(1989); Robertson, et al., "Deposition of Diamond-Like Carbon," *Phil. Transac.: Physical Sciences and Engineering*, Vol. 342, No. 1664, Thin Film Diamond (Feb. 15, 1993), pp. 277-286; and Robertson, "Mechanism of $sp^3$ bond formation in the growth of diamond-like carbon," *Diamond & Related Materials*, Vol. 14, p. 942 (2005). Such spatial separation in the energetics of different atomic and molecular constituents of the depositing precursor species is generally related to "Remote PECVD" developed by Tsu, Deposition of Silicon Based Dielectrics by Remote Plasma Enhanced Chemical Vapor Deposition", Ph.D. Thesis, North Carolina State University, Dept. Phys., Raleigh, NC (1989).

BRIEF DESCRIPTION OF THE DRAWING

Comprehension of the invention is facilitated by reading the following detailed description, in conjunction with the annexed drawing, in which:

FIG. 4 is a schematic representation of a dual-energy mode thin film deposition device in accordance with the invention;

DETAILED DESCRIPTION

Figure 1:
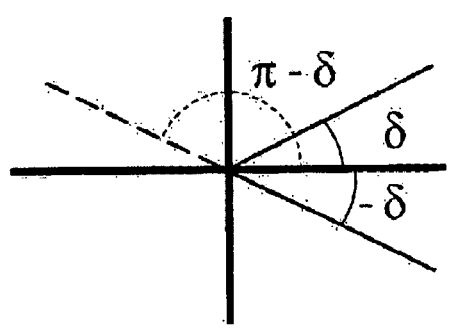
FIG. 1 is a graphical representation of two layer AR solutions.
Figure 2:
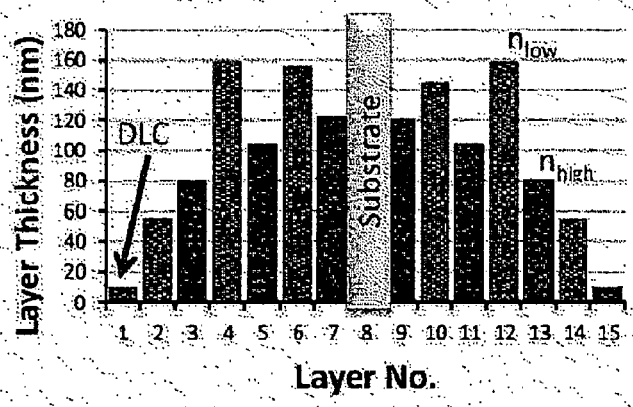
FIG. 2 is a graphical representation of the physical thickness (nm) of the high/low layers in a known multi-layer AR structure comprising three sets of high/low pairs on each side of a glass substrate.
Figure 3:
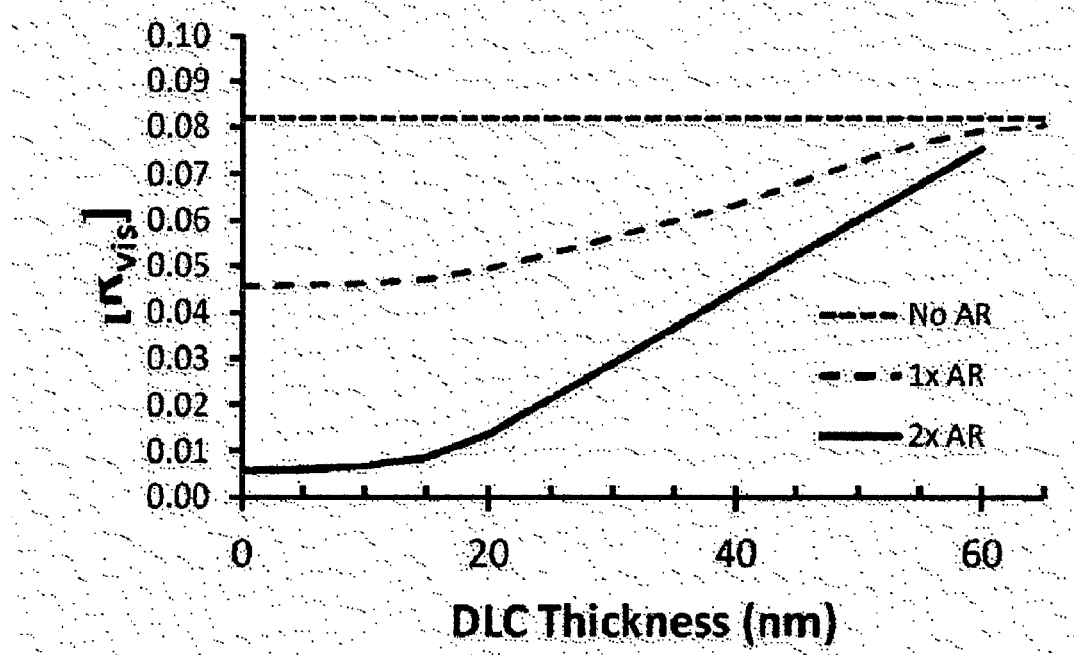
FIG. 3 is a graphical representation of the calculated visible reflectance [$R_{vis}$] of the multi-layer AR structure of represented by the graph in FIG. 2.

FIG. 4 is a schematic representation of a dual-energy mode thin film deposition device in accordance with the invention. Referring to FIG. 4, the main source of high energy carbon atoms is solid graphite target 1. A laser (not shown) emits a focused and pulsed laser beam 2 that directs high power to graphite target 1. Beam 2 ablates carbon on the graphite target to create a pulsed, highly energized carbon plasma jet that quickly expands as it travels toward substrate 7. The amount of ionized carbon in the deposited material can be greatly increased if a pulsed cathodic arc discharge augments the laser ablation. The carbon target may rotate for even wear, and the laser is translatable along a horizontal axis so that the laser can scan along the length of the target. The length of the target defines the first order length-scale for the deposition zone. Longer graphite targets translate into larger dimensions of the substrate that can be coated. Not only does this high power process create plasma 3 of high energy carbon atoms 6e, in the range of 10's of eV (see, Schuelke, infra.), but it also ionizes those atoms creating a plasma of ions and electrons (e).

A spatially distinct inlet 4 introduces low-energy reactant gases containing the fluorine and hydrogen species 6d, illustratively $CF_4$, $CH_4$, and $H_2$, into the reaction chamber (not specifically shown). As the reactant gas(es) expands into the reaction chamber, it interacts with plasma 3 in region 5 of the reaction chamber. In region 5, the electrons (e) of plasma 3 excite chemical species 6d, to create low-energy, but highly chemically-reactive, precursor species 6b, which in this illustrative embodiment, may be $CF_x$, $CH_y$, H. This excitation is similar to the chemical activation that occurs in a PECVD process. As these chemically-active precursors condense on the substrate, they begin to form a deposited thin film 6.

Since the delivery of the high kinetic energy carbon atoms (and ions) to the growing surface of film 6 proceeds simultaneously with the delivery of the low kinetic energy, but highly-chemically reactive species, the high energy carbon species 6c subplant beneath the top few layers, as shown in FIG. 4. The high local pressure experienced by these subplanted C atoms transforms their phase into the tetrahedral ($sp^3$) atom arrangement associated with diamond. Therefore, the combination of the subplanted carbon and the C—F and C—H activated species (6b), forms the desired low-index, but highly rigid DLC-FH material film 6c. It should be noted that this Dual-Energy DLC-FH deposition method is typically carried out under ambient temperature conditions, that is, there is no need to intentionally heat substrate 7 inasmuch as the energy required to promote film growth with the desired properties comes solely from the high energy carbon and electrons which convert gaseous reactants into the low energy but chemically active, precursors in reaction region 5.

Figure 5A:
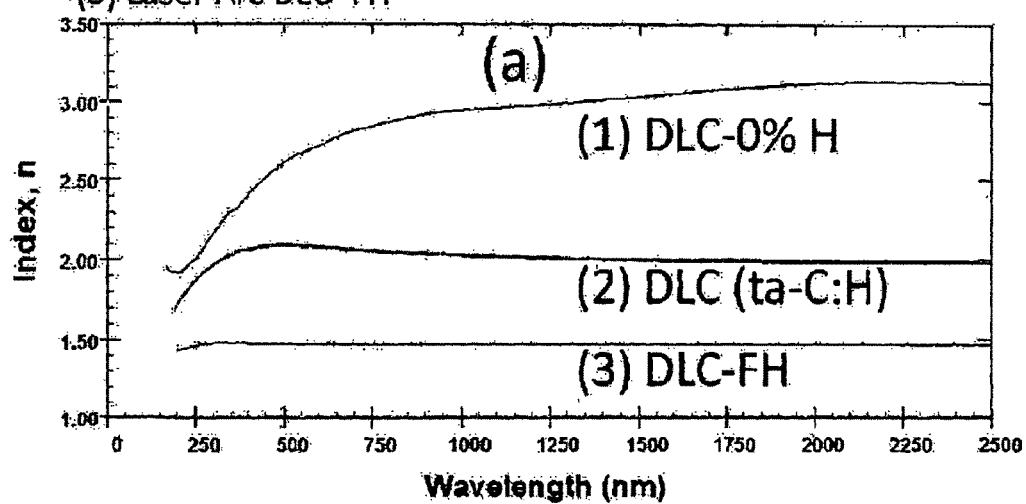
FIGS. 5a and 5b are graphical representation of the measured optical constants, as given by the refractive index [n]
Figure 5B:
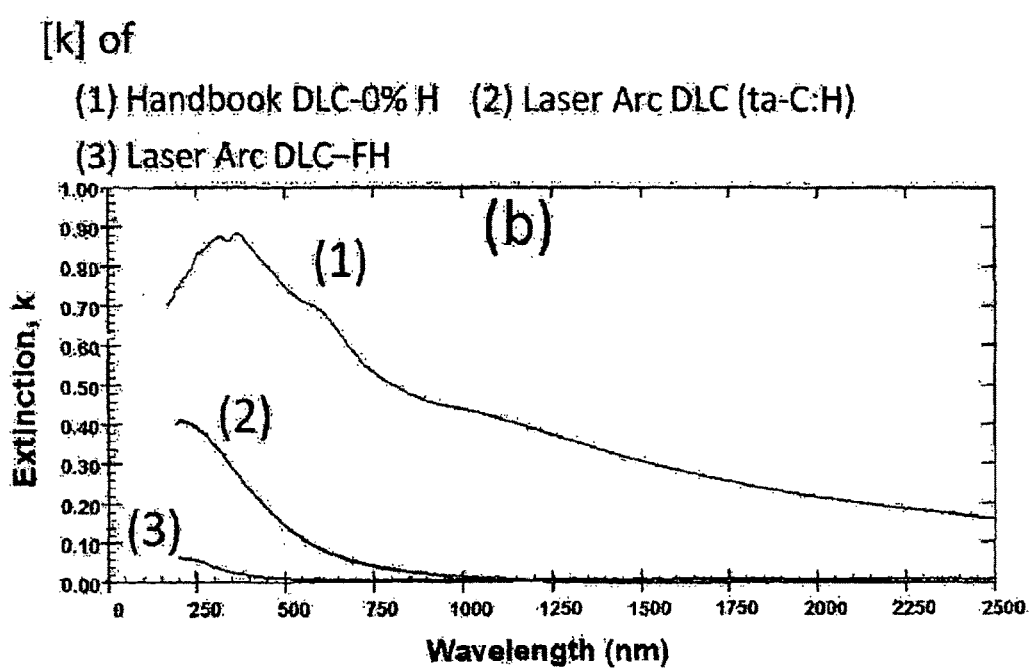

FIG. 5 is a graphical representation of the measured optical constants, as given by the refractive index [η] (FIG. 5a), and the extinction coefficient [κ] (FIG. 5b) for various forms of DLCs. More specifically, trace (1) represents a DLC having no hydrogenation, termed Handbook "DLC-0% H" since the values of the optical constants, η and κ, were taken from the Handbook of Optical Solids II (Alterovitz, et al., supra., at Table VIa). DLC-0% H represents one endpoint where $sp^2$ dominates over $sp^3$ hybridized bonding. It was made by an ion-assisted deposition technique where no hydrogen was used during deposition. Trace (2) in this figure represents a tetrahedral amorphous hydrogenated carbon termed "DLC (ta-C:H)" because it is near the other endpoint in the existing DLC art where $sp^3$ bonding hybridization is dominant. The DLC (ta-C:H) sample was made by the hybrid Laser-Arc (LA) deposition method of the present invention, under conditions using 0.5 Pa of hydrogen background pressures. Trace (3) shows a fluorinated and hydrogenated DLC in accordance with the invention termed "DLC-FH," made by the hybrid LA deposition method, but including the introduction of fluorine by the low-energy process, which in this particular embodiment was 100 sccm of $CF_4$, and where the background hydrogen pressure was increased to 0.9 Pa.

Referring to FIG. 5a, the refractive indices [η] of DLC-0%H is nearly 3.0; DLC (ta-C:H) is about 2.0, and DLC-FH is below 1.5. Especially important to the anti-reflection properties of an AR coating is the fact that the absorption, quantified by the extinction coefficient [κ], shows very strong reduction from DLC-0%H to DLC-FH on FIG. 5b. This is a significant property that adds to the overall importance of the innovative DLC-FH material of the present invention. The utility of a low-[η] material, but which has a rather high [κ], would be considerably diminished in AR applications because it would have decreased transmittance. On the other hand, a material such as DLC-FH, which has a low-[η] accompanied by a low [κ] would have enhanced transmittance, and be particularly useful as an AR coating.

In order to demonstrate the uniqueness of the DLC-FH material of the present invention, as compared to existing DLC materials, the relationship between the measured [η,κ] data and their optical bandgaps ($E_g$), was determined by Tauc plots. Smith, "Optical constants of a hydrogenated amorphous carbon film," *J. Appi. Phys.*, Vol. 55, page 764 (1984); Mott, et al., *Electronic Processes in Non-Crystalline*

*Materials*, 2$^{nd}$ ed. (Clarendon, Oxford, 1979), p. 289; and Tauc, "Optical Properties of Amorphous Semiconductors," *Amorphous and Liquid Semiconductors*, Edited by J. Tauc, (Plenum, New York, 1974), Chap. 4. As will become evident from the following discussion, the Tauc plots demonstrate that the DLC-FH materials of the present invention, as a class, have distinctive behavior relative to [η,κ] versus $E_g$ as compared to the class of materials defined by the existing DLC art. Tauc originally plotted $(\alpha\, h\nu)^{0.5}$ versus hv, where a is the absorption constant, and hv is the photon energy, and where a linear extrapolation to the ordinate value of zero defines the bandgap energy ($E_g$). Since α only depends on [κ] ($\alpha = 4\pi\kappa/\lambda_0$), Smith, supra., makes better use of the full [η,κ] data set, that is, [η] is also used, by plotting an equivalent $(\varepsilon_2 E^2)^{0.5}$ vs. E, where $\varepsilon_2$ is the imaginary part (=2ηκ) of the complex dielectric function, and E=hv, is the photon energy. The Tauc plots for the [η,κ] data for the materials shown in FIG. 5 are presented in FIG. 6.

Figure 6A:
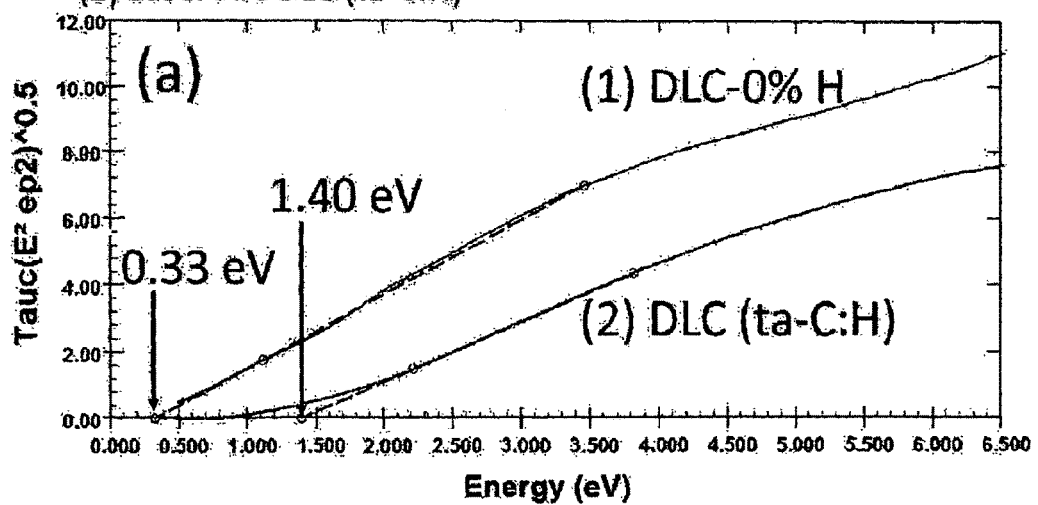
FIGS. 6a and 6b are Tauc plots for the [η,κ] data for the materials shown in FIGS. 5a and 5b.
Figure 6B:
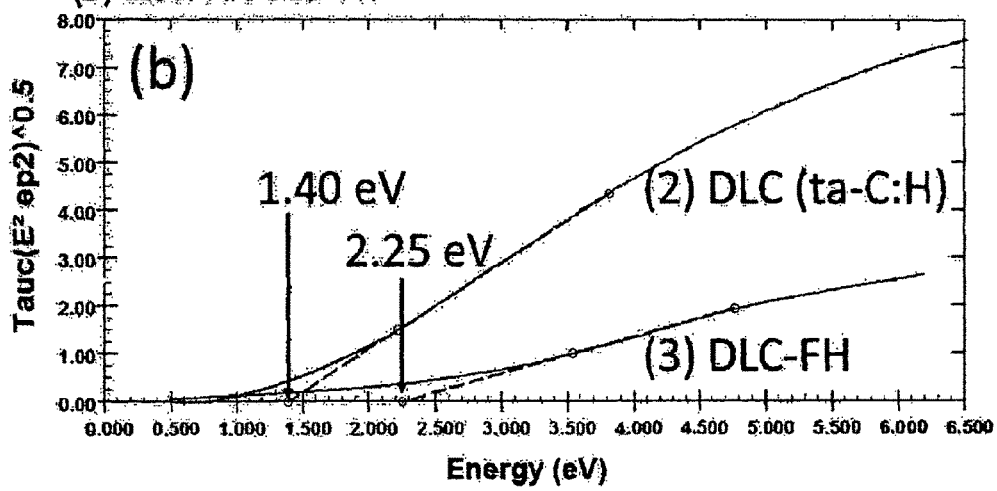

In the Tauc plots shown in FIG. 6, the top panel (FIG. 6a) shows the prior art DLC-0% H (1), and DLC (ta-C:H) (2), while the bottom panel (FIG. 6b) repeats DLC (ta-C: H) (2), but on an expanded scale, and shows DLC-FH (3). The dashed lines are the straight lines expected of the optical edge under the Tauc theory of direct allowed transitions typical of all amorphous materials. In order to minimize the seemingly arbitrary way in which these straight lines are defined, the low- and high-energy end-points, shown as the open circles on FIG. 6, that are as widely separated as possible, and which yield the highest linear correlation coefficient ($R^2$) were selected. By this methodology, $R^2$ is typically at least 3-nines (0.999), and often 4-nines (0.9999), where 1.000 defines the perfect straight line relationship predicted by theory. By this consistent procedure, bandgap energies ($E_g$) were determined to within about ±0.05 eV. The Tauc absorption often does not completely go to zero at the defined $E_g$, i.e., there exists some non-zero absorption at photon energies below $E_g$. This behavior, in fact, is quite typical of all amorphous materials, and is caused by the "Urbach tail" states (see, Tauc, supra. for a discussion of this topic). The following discussion focuses on the Tauc $E_g$.

Figure 7:
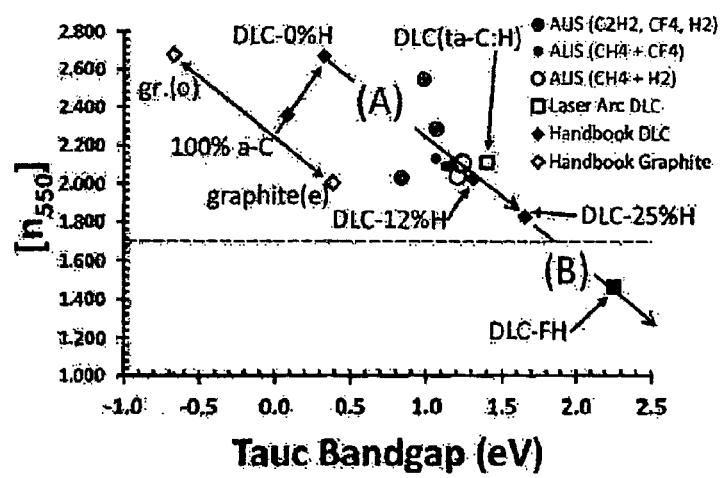
FIG. 7 is a graphical representation of the refractive index at 550 nm [$η_{550}$] versus Tauc bandgap energy ($E_g$) in EV for samples of carbon materials, ranging from graphite to DLC, including the DLC-FH of the present invention.

FIG. 7 is a graphical representation of the refractive index [η] versus Tauc $E_g$ for a variety of carbon materials, ranging from sp$^2$ graphite to the sp$^3$ DLCs measured at a wavelength of 550 nm [η$_{550}$]. This wavelength is particularly relevant in visible reflectance AR designs. Not only is it near the peak solar irradiance, it also defines the peak photooptic sensitivity of human vision. Referring to FIG. 7, sp$^2$ graphite, which is designated as "Handbook Graphite" on the figure, is shown in its ordinary (o) and extraordinary (e) orientations. The constants for Handbook Graphite are taken from Borghesi, et al., "Graphite (C)," *Handbook of Optical Constants of Solids II*, edited by Edward D. Palik (Academic, New York, 1998), p. 449. Since graphite is a semi-metal, its bandgap should in fact be negative as shown on FIG. 7 (see, Kittel, *Introduction to Solid State Physics*, 5$^{th}$ Edition, (Wiley, New York, 1976), p. 184). It is significant that an amorphous carbon made by arc deposition (Alterovitz, supra., Table VII), herein designated "Handbook 100% a-C" essentially bisects the (crystalline) graphite (o) and (e) orientations, as one might expect from an amorphous carbon material where long range order is absent. For this a-C material, sp$^2$ bond hybridization may dominate, so that the sp$^3$ content is practically zero. Therefore, a-C is not properly referred to as a DLC.

Referring again to FIG. 7, the Handbook DLC-0% H sample, produced by an ion-assisted deposition method (see, Alterovitz, supra., Table Via) shifts significantly off the graphite line. Now, with the use of a high energy subplantation process, sp$^3$ bonding hybridization begins to play a role in the as-formed DLC material. This point marks the beginning of "true" DLC material and the endpoint of the line which is designated as "A" on FIG. 7. All published DLC materials appear to fall on, or very near, to this A-line, including the Handbook DLC-12% H (Alterovitz, supra., at Table Vib) and the Handbook DLC-25% H (Alterovitz, supra., at Table Vic). The DLC-25% H point appears to mark the opposite endpoint of the A-line, where as noted in the aforementioned Alterovitz Handbook, the refractive indices of DLCs lie above a threshold shown on FIG. 7 as the horizontal dashed line.

The materials for the other points shown on FIG. 7 were made in accordance with the hybrid Laser-Arc (LA) deposition method of the present invention. The DLC (ta-C:H) sample was made by the LA process (energies of 10's of eV), using 0.5 Pa of $H_2$ pressure, but with no fluorine-containing gases. The carbon content derives solely from the high-energy mechanism. The Tauc bandgap of DLC (ta-C: H) (shown on FIG. 7 as "□") is essentially the same as the Tauc bandgap of DLC-12%H Handbook material. However, by introducing a fluorinated-carbon species, illustratively $CF_4$, at 100 sccm, in the down-stream, low energy region, it is possible to produce the low-index DLC-FH state (shown on FIG. 7 as "■") whose [η] is below the accepted threshold of known DLCs.

Although the trend, indicated by the line designated "B" on the figure, appears to be the same as the A-line, the B-line is below the DLC threshold (i.e., horizontal dashed line). None of the conventional DLC samples exist below this threshold. The fact that the A- and B-lines appear to be parallel and lie on the same line, may simply be a result of the empirical Moss rule, where the index and bandgaps of different semiconducting materials appear to be simply related, as $\eta^4 E_g$=constant. (See, Pancove, *Optical Processes in Semiconductors*, (Dover, New York, 1971), p. 89)

Nevertheless, simply using fluorine does not automatically guarantee that the DLC-FH state can be produced. As will be discussed hereinbelow, producing this state depends on how the fluorine is energized.

For example, a number of DLC samples were made by another high-energy method called Anode Layer Ion Source (ALIS). For additional information on ALIS, see, for example, Madocks, supra.; Veerasamy, et al., "Large Area Ion-Beam Deposition of Hydrogenated Tetrahedral Amorphous Carbon on Soda-Lime Glass," *Soc. Vac. Coaters,* 45th Annual Technical Conference Proceedings (2002), p. 127; Dudnikova, et al., "Ion source with closed drift anode layer plasma acceleration," *Rev. Sci. Inst.*, Vol. 73, No. 2, p. 729 (2002); and Madocks, et al., "Plasma Enhanced Chemical Vapor Deposition (PECVD) for Large Area Applications," *Soc. Vac. Coaters,* 53rd Annual Technical Conference Proceedings, Orlando, Fla. April 17-22 (2010), p. 247. Referring to FIG. 7, the properties of these DLC samples are shown by the circles.

Even though the ALIS process is capable of delivering high energies, e.g., 100's of eV, the resulting fluorinated and/or hydrogenated DLC samples did not have the desirable low-index properties of the DLC-FH material of the present invention (that is, they did not fall below the horizontal dashed threshold line). Referring to FIG. 7, the properties of the samples produced by ALIS are shown as follows: grey circles where the principal carbon source was acetylene ($C_2H_2$), some samples being purely carbon, while others were mixed with fluorine and/or hydrogen containing gases ($CF_4$, and $H_2$); and black circles where methane ($CH_4$)

was the principal source of carbon, mixed with fluorine (CF$_4$) or open circles if mixed with hydrogen (H$_2$).

All of the DLC samples made by ALIS are solidly on, or near, the A-line and have indices well above the lower 1.7 index threshold (horizontal dashed line) of DLCs despite the use of fluorine ion some of the samples. Thus, it is clear that introducing fluorine and/or hydrogen with high energy sources alone does not produce the low-index DLC-FH material of the present invention. Production of the low-index material of the present invention requires, in addition to a high energy mechanism, a low energy mechanism in which to simultaneously chemically excite the reactive species, which may be, in preferred embodiments, CF$_x$ containing species. The CF$_x$ active radicals react on the surface of the growing film, while energetic carbon species (ions and atoms) from the high energy mechanism (which may be LA) subplants through these CF layers to create the highly advantageous DLC-FH state.

In the [$\eta_{550}$] vs. E$_g$ plot of FIG. 7, the distinction between the A- and B-lines appear only as demarked by the DLC threshold line. However, FIG. 8, which is a graphical representation of the corresponding extinction coefficient plot of [$\kappa_{550}$] vs. E$_9$, clearly shows that the A- and B-lines are quite distinct. In the [$\kappa_{550}$] plot shown on FIG. 8, all the graphite, a-C, and DLC points fall on or very near to the A-line which represents the known local phases of carbon. The DLC-FH of the present invention, which has with significant amounts of bonded C-F and C-H, and is deposited in accordance with a method embodiment of the invention, represents a material that is distinct from these known phases of carbon as demonstrated by the distinction between the B-line and the A-line on FIG. 8.

Figure 8:
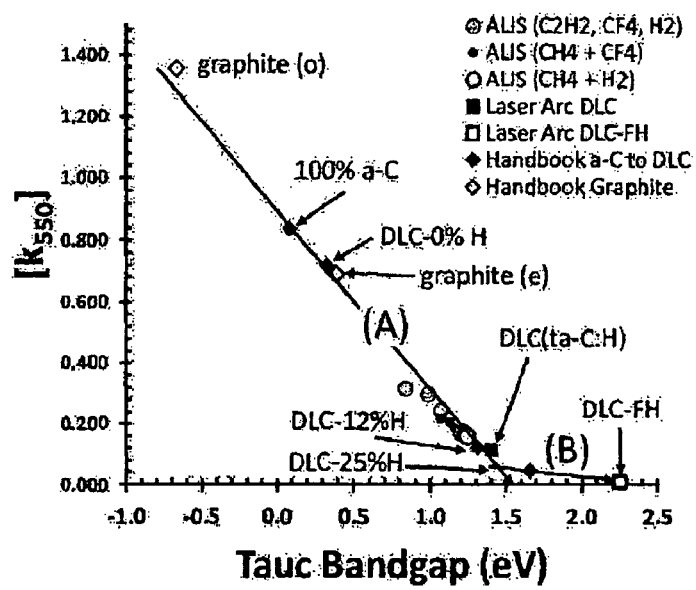
FIG. 8 is a graphical representation of the extinction coefficient at 550 nm [$κ_{550}$] versus Tauc bandgap energy ($E_g$) in EV for the carbon materials, ranging from graphite to DLC, derived from the samples shown in FIG. 7.

In FIG. 8, a particularly preferred DLC-FH sample prepared by Laser Arc ("□") had a very low low [$\kappa_{550}$]. One interpretation of the B-line is that, in order for [$\kappa$] to approach zero at 550 nm wavelength, the bandgap must approach 2.25 eV, since this would also be the photon energy of this wavelength. In this case, if the A-line were to approach zero, this would mean that it must transition over to the B-line. It appears that indeed, the DLC-25% H point falls on this line for this very reason, and so one could interpret this to mean that the DLC-25% H material should belong to the same class as the DLC-FH material of the present invention. However, this is not the case, since the [$\eta_{550}$, $\kappa_{550}$] behavior of DLC-25% H material does not both coincide with the DLC-FH materials.

A number of samples have been made in accordance with the dual energy process of the present invention. Table 2 identifies a number of samples having [C—H] and [C—F] content ranging from zero and up. As used in Table 2, samples made with only hydrogen in the low energy component are designated "DLC-H", whereas sample made with fluorine only are designated "DLC-F." Of course, samples made with both fluorine and hydrogen are referred to as "DLC-FH." It should be understood, however, that the term "DLC-FH" as used herein refers generally to the class of carbon-based material made in accordance with the dual energy process of the present invention. The deposition conditions, or process parameters, used to grow the identified samples are provided in the table, along with the measured optical properties and bandgap energy (E$_g$).

TABLE 2

| Material | ID | CF$_4$ flow (sccm) | H$_2$ pres. (Pa) | Optical constants [n$_{550}$] | [k$_{550}$] | Eg (eV) |
| --- | --- | --- | --- | --- | --- | --- |
| DLC-H | DLC-H, 1.5 Pa | 0 | 1.5 | 1.651 | 0.011 | 2.064 |
|  | DLC-H, 2.0 Pa | 0 | 2 | 1.535 | 0.011 | 2.086 |
| DLC-F | DLC-F-50 | 50 | 0 | 1.687 | 0.097 | 1.152 |
|  | DLC-F-60 | 60 | 0 | 1.554 | 0.055 | 1.434 |
|  | DLC-F-70 | 70 | 0 | 1.538 | 0.045 | 1.540 |
|  | DLC-F-80 | 80 | 0 | 1.465 | 0.026 | 1.615 |
|  | DLC-F-100 | 100 | 0 | 1.427 | 0.031 | 1.634 |
|  | DLC-F-120 | 120 | 0 | 1.372 | 0.028 | 2.111 |
|  | DLC-F-140 | 140 | 0 | 1.308 | 0.040 | 1.851 |
| DLC-FH | DLC-FH-80-0.5 Pa | 80 | 0.5 | 1.449 | 0.020 | 1.984 |
|  | DLC-FH-100-0.7 Pa | 100 | 0.7 | 1.480 | 0.023 | 2.209 |
|  | DLC-FH-100-0.9 Pa | 100 | 0.9 | 1.472 | 0.009 | 2.253 |

Figure 9:
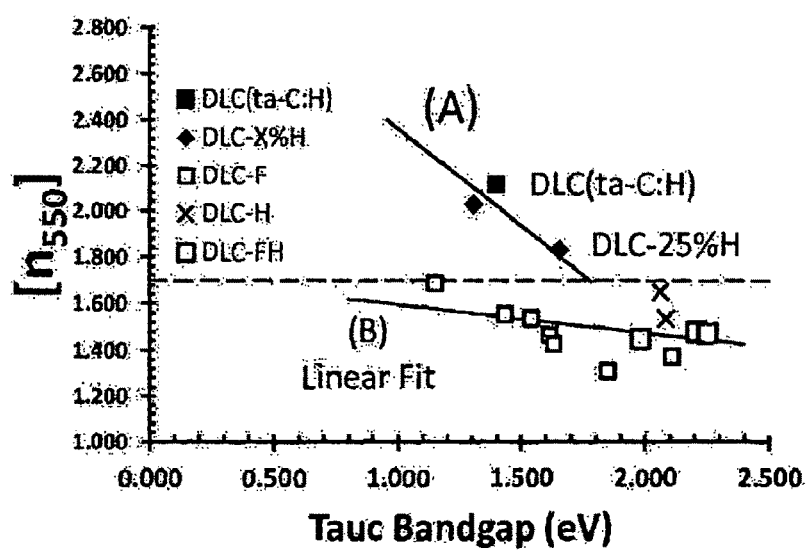
FIGS. 9 and 10 are graphical representations of the data presented in Table 2.
Figure 10:
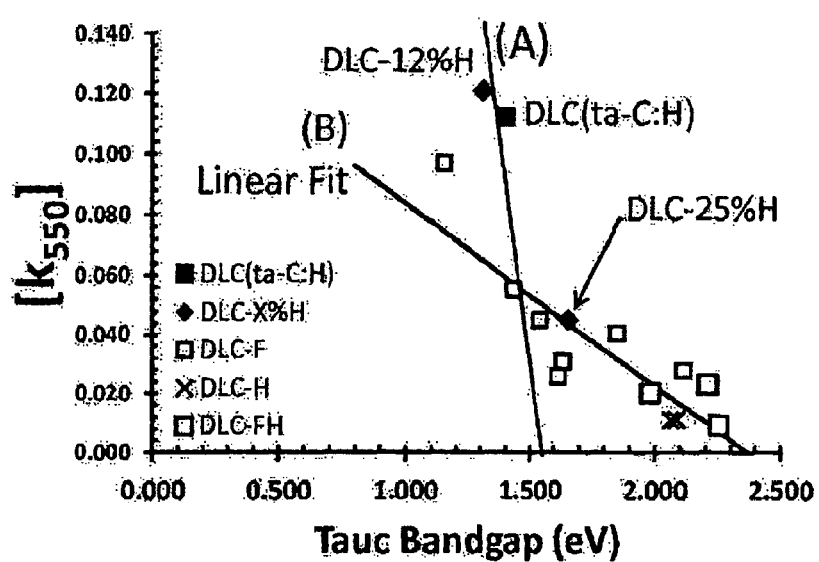

FIGS. 9 and 10, are graphical representations of the data shown in Table 2 plotted in the same way as previously shown in FIGS. 7 and 8, respectively. The DLC-FH data, including the -H and the -F versions, have been linearly fit to independently define the B-lines, noted above, in FIGS. 9 and 10. In each of these plots, the B-lines are quite distinct from the A-lines. As discussed above, the [$\kappa_{550}$] point for the DLC-25%H appears to fall on the B-line of FIG. 8. It appears to fall likewise on the fit-B-line of FIG. 10. However, in the [$\eta_{550}$] plot, the DLC-25%H point is in no way associated with the group of DLC-FH points as represented by the fit-B-line on FIG. 9. This demonstrates that just because a samples, such as DLC-25%H, have carbon and hydrogen content, similar to the DLC-H (and preferred DLC-FH) samples made in accordance with the method of the present invention, they obviously do have the same atomic structure, nor do they have the same optical properties. In other words, the class of materials represented by the DLC-25%H is not in the same class of materials as represented by the DLC-FH materials of the present invention.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof. Moreover, the technical effects and technical problems in the specification are exemplary and are not limiting. The embodiments described in the specification may have other technical effects and can solve other technical problems.

What is claimed is:

1. A method of making a diamond-like carbon material containing fluorine and/or hydrogen (DLC-FH) in a deposition chamber of a pulsed cathodic arc (PCA) and/or pulsed laser (PL) evaporation system, the system including a carbonaceous (graphite) target and a distally spaced apart substrate having a growth surface, the method comprising:
   a) contacting the target with a pulsed high energy laser beam and/or creating a cathodic vacuum arc discharge originating from the target surface to produce a plasma of highly energized carbon atoms, ions, and electrons that travel in the chamber in the direction of the substrate;
   b) providing an inlet in the reaction chamber for reactant gas(es) which are a source of fluorine and hydrogen species, the inlet being arranged in the deposition chamber between the target and the substrate;

c) exciting fluorine and hydrogen precursor gas(es) by contact with electrons in the plasma to create low-energy, but highly chemically-reactive, precursor species which are a source of fluorine and hydrogen species in the reactant gas(es); and d) contacting a growth surface of the substrate with the low-energy, but highly chemically-reactive, precursor species and the highly energized carbon atoms, ions, and electrons to deposit layers of carbon material containing fluorine and/or hydrogen on the growth surface of the substrate, so that the highly energized carbon atoms subplant beneath the top layer(s) of the carbon material to promote the formation of tetrahedral ($sp^3$) atom arrangements typically associated with the bonding hybridization found in diamond.

2. The method of claim 1 wherein the substrate is selected from the group consisting of glass and translucent polymers.

3. The method of claim 2 wherein the substrate is glass.

4. The method of claim 3 wherein the glass is soda lime glass.

5. The method of claim 1 wherein the low-energy reactant gas(es) are selected from the group consisting of consisting of $CF_4$, $CH_4$, and $H_2$.

6. The method of claim 1 wherein the energy-per-carbon atom from the pulsed energy laser beam and/or cathodic vacuum arc discharge is from about 10 electron-volt (eV) to 500 eV.

7. A diamond-like carbon material containing fluorine and hydrogen made by the process of:

a) contacting a carbonaceous target with a pulsed high energy laser beam and/or creating a cathodic vacuum arc discharge originating from the target surface to produce a plasma of highly energized carbon atoms, ions, and electrons that travel in the direction of a distally spaced apart substrate having a growth surface in a chamber of a pulsed cathodic arc and/or pulsed laser evaporation system;

b) exciting fluorine and hydrogen species in reactant gas(es) by contact with electrons in the plasma to create low-energy, but highly chemically-reactive, precursor species in a reaction zone intermediate of the target and the growth surface of the substrate; and c) simultaneously contacting the growth surface of the substrate with low-energy, but highly chemically-reactive, precursor species and the highly energized carbon atoms, ions, and electrons to deposit layers of carbon material containing fluorine and hydrogen on the growth surface of the substrate, the highly energized carbon atoms subplanting beneath the top layer(s) of the deposited carbon material to promote the formation of tetrahedral ($sp^3$) atom arrangements typically associated with the bonding hybridization found in diamond.

8. The diamond-like carbon material containing fluorine and hydrogen made by the process of claim 7 wherein the energy-per-carbon atom from the pulsed energy laser beam and/or cathodic vacuum arc discharge is from about 10 electron-volt (eV) to 500 eV.

9. The diamond-like carbon material containing fluorine and hydrogen made by the process of claim 7 having the following optical properties:

a) a refractive index, at photon wavelengths of 550 nm, that is less than about 1.7, and preferably ranging from less than about 1.5 to less than 1.3;

b) an extinction coefficient at wavelength 550 nm of less than about 0.06, and preferably ranging from less than about 0.04 to less than 0.01; and c) an optical bandgap which is greater than 1.3 eV, and preferably greater than about 1.5 eV.

10. The diamond-like carbon material containing fluorine and hydrogen made by the process of claim 7 wherein the substrate is selected from the group consisting of glass and translucent polymers.

11. The diamond-like carbon material of claim 10 wherein the substrate is glass.

12. The diamond-like carbon material of claim 11 wherein the glass is soda lime glass.

13. The diamond-like carbon material containing fluorine and hydrogen made by the process of claim 7 wherein the reactant gas(es) are selected from the group consisting of consisting of $CF_4$, $CH_4$, and $H_2$.

* * * * *